United States Patent [19]

Kuzuhara

[11] Patent Number: 5,138,405
[45] Date of Patent: Aug. 11, 1992

[54] QUASI ONE-DIMENSIONAL ELECTRON GAS FIELD EFFECT TRANSISTOR

[75] Inventor: Masaaki Kuzuhara, Tokyo, Japan
[73] Assignee: NEC Corporation, Tokyo, Japan
[21] Appl. No.: 709,792
[22] Filed: Jun. 3, 1991

Related U.S. Application Data

[63] Continuation of Ser. No. 670,457, Mar. 12, 1991, abandoned, which is a continuation of Ser. No. 545,869, Jun. 29, 1990, abandoned.

[30] Foreign Application Priority Data

Jun. 29, 1989 [JP] Japan .................. 1-165242
Jun. 29, 1989 [JP] Japan .................. 1-165243

[51] Int. Cl.$^5$ .............. H01L 29/161; H01L 29/205; H01L 27/12; H01L 29/80
[52] U.S. Cl. ............................ 357/16; 357/4; 357/22
[58] Field of Search .................. 357/4, 16, 22

[56] References Cited

U.S. PATENT DOCUMENTS

| | | | |
|---|---|---|---|
| 4,591,889 | 5/1986 | Gossard et al. | 357/16 |
| 5,079,594 | 1/1992 | Mitsuyu et al. | 357/4 |
| 5,081,512 | 1/1992 | Kelly et al. | 357/4 |

OTHER PUBLICATIONS

Mochigetsu "Sattellite Broadcasting reception HEMTs" *Nikkei Microdevices* Apr. 4, 1989, pp. 91–95.
"Quasi-one-dimensional Channel GaAs/AlGaAs Modulation Doped FET Using Corrugated Gate Structure," Okada et al, Extended Abstracts of the 20th (1988 International) Conference on Solid State Devices and Materials, Tokyo, pp. 503–506 (1988).

*Primary Examiner*—Andrew J. James
*Assistant Examiner*—Daniel N. Russell
*Attorney, Agent, or Firm*—Burns, Doane, Swecker & Mathis

[57] ABSTRACT

A quasi one-dimensional electron gas FET with semiconductor layer of a stripe structure formed on a semi-insulating semiconductor substrate. A gate electrode is formed traversing the exposed portions of the semiconductor substrate and the side faces and the upper face of the stripe structure, and a source electrode and a drain electrode are formed on the respective ends of the stripe structure with the gate electrode in between. The stripe structure consists of a potential barrier layer, an undoped channel layer and an electron supplying layer.

9 Claims, 4 Drawing Sheets

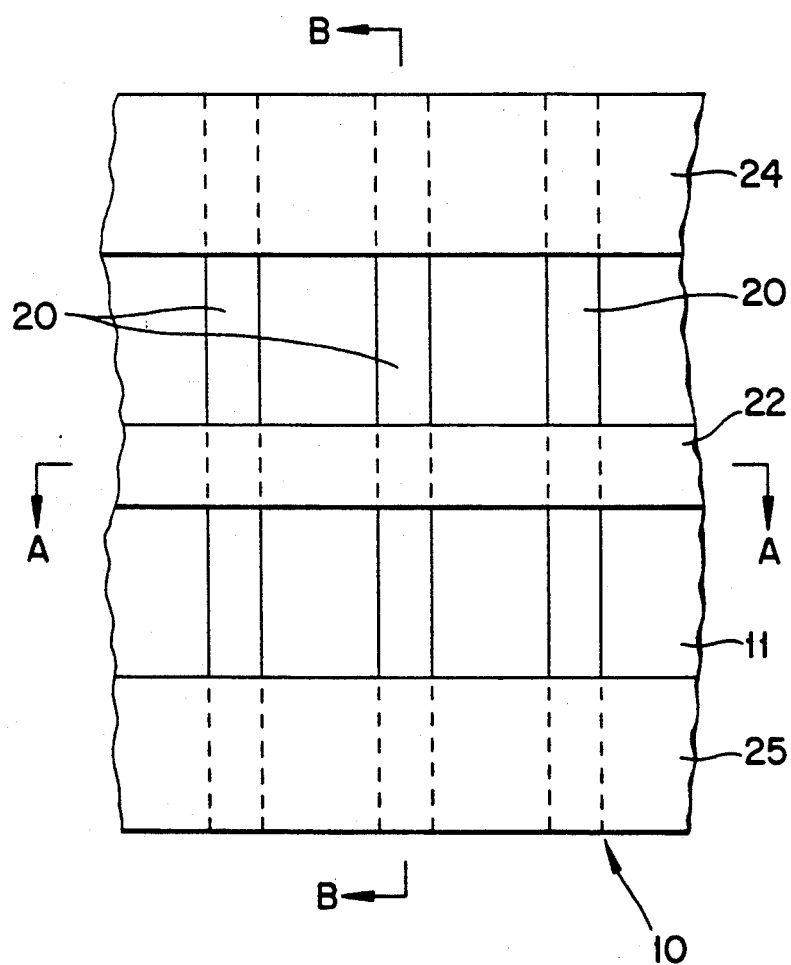

QUASI ONE-DIMENSIONAL ELECTRON GAS FIELD EFFECT TRANSISTOR

This application is a continuation of application Ser. No. 07/670,457, filed Mar. 12, 1991, now abandoned which is a continuation of application Ser. No. 07/545,869, filed Jun. 29, 1990 now abandoned.

BACKGROUND OF THE INVENTION

The present invention relates to a field effect transistor (referred to as an FET hereinafter) using a compound semiconductor, and more particularly to an FET employing a quasi one-dimensional electron gas regime that is generated in selectively doped heterojunction interfaces of a striped channel structure.

DESCRIPTION OF THE PRIOR ART

A two-dimensional electron gas field effect transistor which utilizes excellent carrier transport characteristics of two-dimensional electron gas generated in the selectively doped heterojunction interfaces is expected to become available as a low noise element or a large power element for the ultra-high frequency band and a fundamental element for very high speed digital integrated circuits.

Lately, active investigations are being pursued on a quasi one-dimensional electron gas FET. The investigation is aimed at further enhancing the performance of a two-dimensional electron gas FET by restricting the direction of the motion of its two-dimensional electron gas to only one direction i.e., from the source to the drain. As a quasi one-dimensional electron gas FET, one may mention the type in which a part of the two-dimensional electron gas is depleted by the application of a gate bias across striped N type cap layers.

One example of this kind is disclosed in the 20th International Conference on Solid State Devices and Materials, Tokyo, 1988, Extended Abstracts, pp. 503-506 by M. Okada et al.

In such a quasi one-dimensional electron gas FET, a FET operation which literally reflects the transport characteristic of a quasi one-dimensional electron gas can be expected in only a small range of operation i.e., where the gate length is relatively large and the electric field intensity to be applied to the channel layer is sufficiently small. However, if one attempts to diminish the gate length in order to enhance characteristics in the ultra-high frequency band, the motion of the electrons in the channel layer (accelerated by the high electric field) diverges from one-dimensional electron gas to two-dimensional, and even to three-dimensional electron gas, with an accompanying deterioration in the electron mobility. In other words, it has not been possible in conventional quasi one-dimensional electron gas FET to expect an excellent high frequency operation at high electric fields.

BRIEF DESCRIPTION OF THE INVENTION

Object of the Invention

It is an object of the present invention to provide a field effect transistor which can generate a quasi one-dimensional electron conduction in a wide range of operation, even at high electric fields.

It is another object of the present invention to provide a field effect transistor which obtains an excellent high frequency characteristic even for high electric fields.

SUMMARY OF THE INVENTION

The field effect transistor in accordance with the present invention includes a semi-insulating semiconductor substrate, a plurality of laminated structures, each consisting of a first semiconductor layer, a second semiconductor layer having an electron affinity greater than that of the first semiconductor layer and a third semiconductor layer having an electron affinity which is substantially the same as that of the first semiconductor layer, formed in stripe shapes on the substrate, a gate electrode which traverses uninterruptedly the portions of the surface of the semi-insulating semiconductor substrate exposed between the plurality of the striped laminated structures and both of the side faces and the upper faces of the plurality of the striped laminated structures, and extends in the direction intersecting the lengthwise direction of the stripes, and a source electrode and a drain electrode which commonly connect the respective ends in the lengthwise direction of the striped laminated structures with the gate electrode in between.

In accordance with the field effect transistor of the present invention, it is possible to control the quasi one-dimensional electron gas that is generated in the interfaces of the second semiconductor layers of the selectively doped heterojunctions not only with a gate electric field pointed toward the substrate but also with gate electric fields pointed sideways from both side faces of the striped layers. In other words, it is possible to suppress the two-dimensional motion of the electron gas. In addition, the first semiconductor layer between the electron gas and the substrate acts as a potential barrier layer so that it is possible to suppress the divergence of the quasi one-dimensional electron gas in the direction toward the substrate, thereby restricting the three-dimensional motion of the electron gas.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 1 is a plan view showing a first embodiment of the quasi one-dimensional electron gas FET according to the present invention;

FIGS. 2a to 5a and FIGS. 2b to 5b are sectional views of the first embodiment of the quasi one-dimensional electron gas FET of the present invention as arranged in the order of its fabrication, where FIGS. 2a to 5a are sectional views taken along the line A—A in FIG. 1 and FIGS. 2b to 5b are sectional views taken along the line B—B in FIG. 1;

DETAILED DESCRIPTION OF THE PREFERRED EMBODIMENTS

Figure 5B:
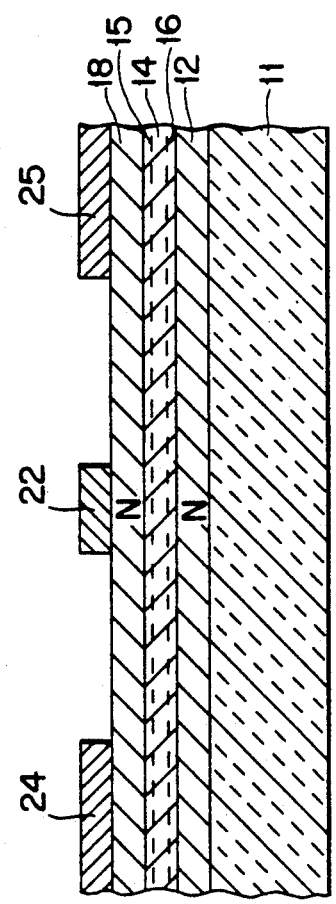
Figure 5A:
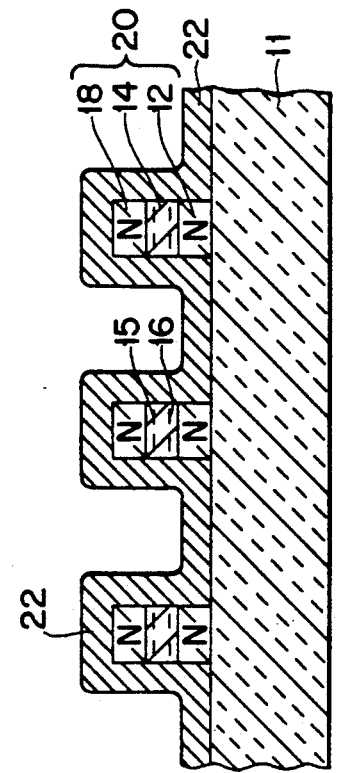

Referring to FIG. 1 and FIGS. 5a and 5b, the quasi one-dimensional electron gas FET 10 according to the first embodiment of the present invention includes a plurality of multilayered stripes 20 provided on the surface of a semi-insulating GaAs substrate 11. Each of the stripes 20 consists from the bottom upward a N type AlGaAs layer 12, an undoped GaAs layer 14 and an N type AlGaAs layer 18, where the lower layer 12 and the upper layer 18 serve as electron supplying layers, and the intermediate layer 14 serves as a channel layer. In the upper and the lower interfaces of the channel layer 14, there are formed quasi one-dimensional electron gases 15 and 16 by the two electron supplying layers 12 and 12. The lower layer 12 serves also as a potential barrier layer.

A source electrode 24 is provided on one of the end portions in the lengthwise direction of the stripes 20, connecting one end of each of the stripes 20 in common while a drain electrode 25 is provided placed commonly on the other end of the stripes 20. These electrodes have a constitution in which a gold-germanium (AuGe) layer is overlaid with a nickel (Ni) layer.

At about the central part in the lengthwise direction of the stripes 20, there is provided a gate electrode 22 which runs in the direction perpendicular to the lengthwise direction of the stripes 20. The gate electrode 22, which has a constitution in which a Ti layer is overlaid with an Al layer 9 covers uninterruptedly the portions of the surface of the substrate 11 exposed between the stripes 20, one of the side faces, the upper surface and the other side face of the respective stripes 20.

Referring to FIGS. 2a to 5a and FIGS. 2b to 5b, the method of fabrication of the FET in FIG. 1 will be described.

Figure 2A:
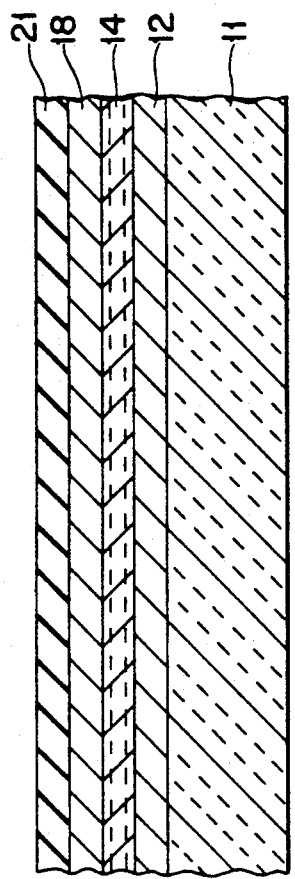
Figure 2B:
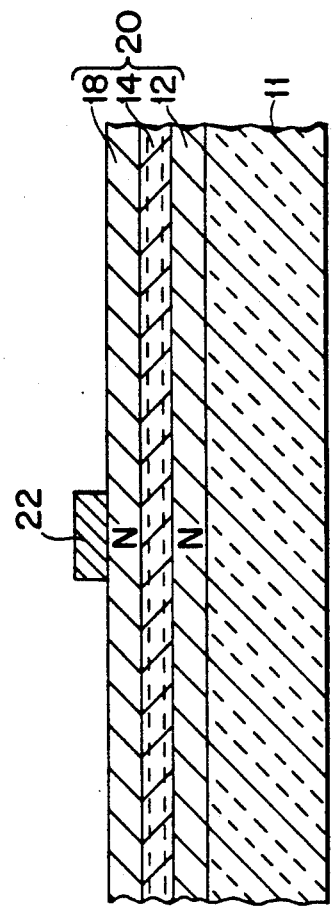

First, as shown in FIGS. 2a and 2b, a 100 nm-thick N type AlGaAs layer (lower layer) 12 doped with silicon to a concentration of about $2 \times 10^{18}$ cm$^{-3}$, a 60 nm-thick undoped GaAs layer (intermediate layer) 14 and a 30 nm-thick N type AlGaAs layer (upper layer) 18 doped with silicon to a concentration of about $2 \times 10^{18}$ cm$^{-3}$ are sequentially deposited epitaxially on a semi-insulating GaAs substrate 11 by means a molecular beam epitaxy (MBE) or a metal organic chemical vapor deposition (MOCVD). The composition ratios of AlGaAs in the AlGaAs layer of the layer 12 and the layer 18 are set to be Al:Ga:As=0.3:0.7:1.0. Next, resist 21 is formed on the portions intended for the stripes by means of direct writing electron beam lithography. The width of the resist 21 in the intended portions for the stripes is set to be about 0.3 μm, and the ratio of the stripe width to the space between the stripes is set to be 1:2.

Figure 3A:
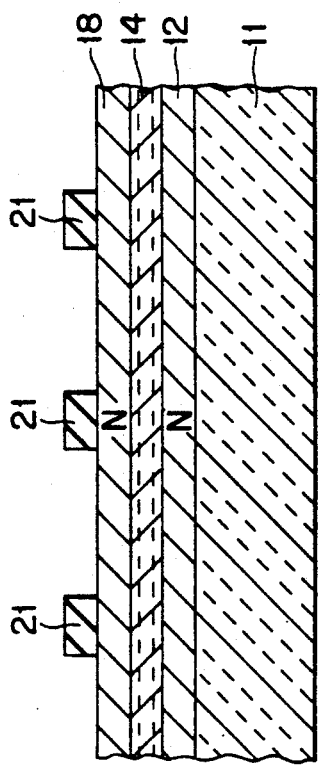
Figure 3B:
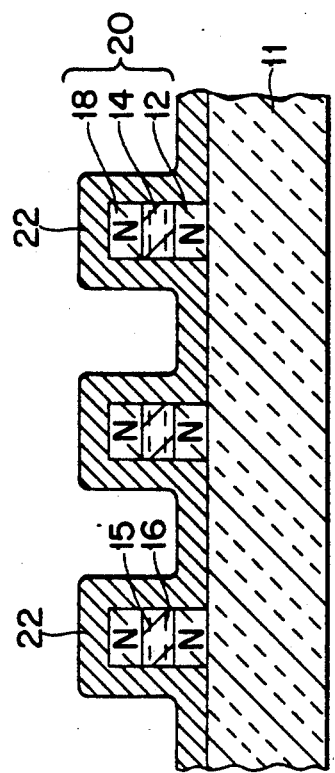

Then, stripe layers 20 are formed as shown in FIGS. 3a and 3b by selectively etching the upper layer N type AlGaAs layer 18, the undoped GaAs layer 14 and the lower layer N type AlGaAs layer 12 by means of a wet etching that uses phosphoric acid ($H_3PO_4$) solution or a dry etching that uses chlorine ($Cl_2$) gas, with the resist 21 as the mask. As a result, the surface of the substrate 11 is exposed between the stripe layers 20. Next, after removing the resist 21 and sequentially depositing a titanium (Ti) layer and an aluminum (Al) layer by evaporation or sputtering, a gate electrode 22 with a length of about 0.25 μm is formed by selective etching.

Figure 4B:
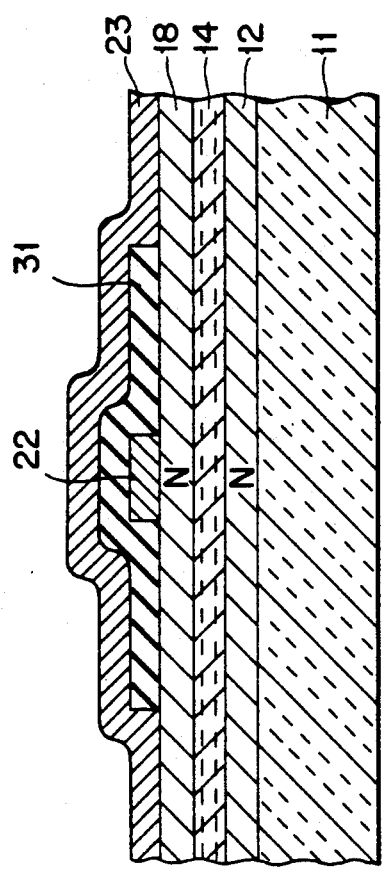
Figure 4A:
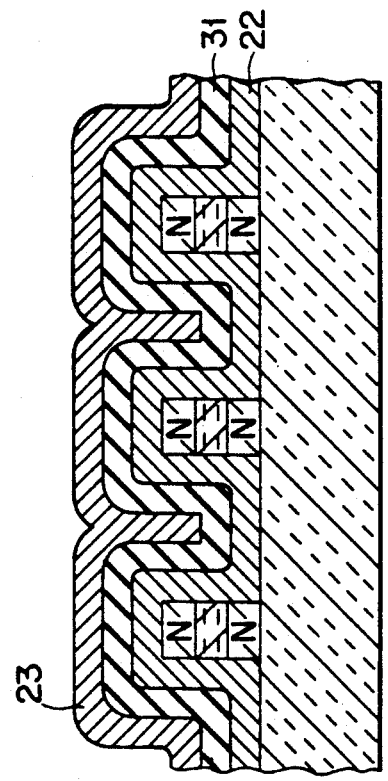

Next, as shown in FIGS. 4a and 4b, resist 31 is formed on the portions other than those intended for the source and the drain electrodes, then a layer 23 is formed by sequentially evaporating a gold-germanium alloy layer and a nickel layer.

Then, as shown in FIGS. 5a and 5b, a source electrode 24 and a drain electrode 25 consisting of gold-germanium and nickel are formed by a lift-off process which removes unwanted gold-germanium and nickel along with the resist 31, completing an element part by subjecting it to a heat treatment at 420° C.

In accordance with the present embodiment, there can be obtained a quasi one-dimensional electron gas FET which can control the quasi one-dimensional electron gases 15 and 16 that are generated in the interfaces of the selectively doped heterojunctions on the stripes not only by a gate electric field that is directed from the surface toward the substrate but also by the gate electric fields which are pointed from both side faces of the stripe structures 20 sideways. Consequently, the lateral divergence of these quasi one-dimensional electron gases 15 and 16 can be suppressed even when the accelerating electric field in the direction of stripes becomes high. Further, as to the divergence of the quasi one-dimensional electron gases 15 and 16, it can be kept to a minimum since there is provided a potential barrier layer 12 with a large band gap energy between the channel layer 14 and the semi-insulating substrate 11. Consequently, it is possible to maintain one-dimensional electron conduction even when operated under high electric fields. This enables one to obtain an FET with high current gain cut-off frequency under a wide range of bias conditions.

The current gain cut-off frequency for the case when a voltage of 2 V is applied between the source and the drain of an FET of the present embodiment with 0.25 μm gate length and 0.3 μm stripe width, reached 55 GHz. The current gain cut-off frequency measured of the prior art FET under the identical conditions as above was 35 GHz, which demonstrates the effect of the present invention.

Moreover, in the quasi one-dimensional electron gas FET 10 in accordance with the present embodiment, electrons are supplied to the channel layer 14 by both the upper and lower electron supplying layers 18 and 12 that sandwiches the channel layer 14, so that it becomes possible to realize a high current operation.

Furthermore, the depletion layer due to the application of a gate voltage not only extends in the direction from the gate side to the substrate but also extends from both side faces of the stripe structures 20 so as to wrap the stripe structures, providing an improved control of the conduction electron flow for the same changes in the gate voltage, whereby making it possible to obtain a large value for the transconductance.

It should be noted that the FET in accordance with the present invention can be fabricated by a relatively simple process, and can be applied to a wide range of use, i.e., from low noise elements in the ultrahigh frequency band to fundamental elements for very high speed digital integrated circuits.

Figure 6B:
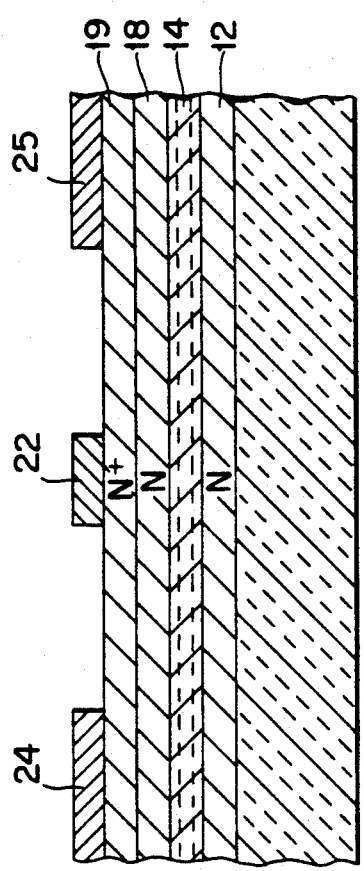
FIGS. 6a and 6b are sectional views taken along the lines A—A and B—B, respectively, in FIG. 1 of a second embodiment of the quasi one-dimensional electron gas FET according to the present invention.
Figure 6A:
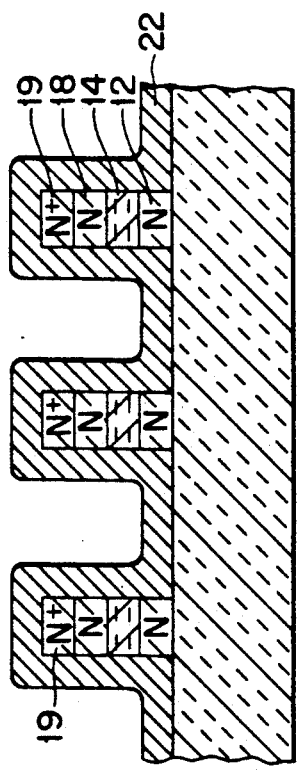

In the above embodiment, the gate electrode 22 and the source and the drain electrodes 24 and 25 are formed on the N type AlGaAs electron supplying layer 18 in the upper layer in direct contact with it. However, it is possible to reduce the contact resistances and the parasitic resistances of the source and the drain electrodes 24 and 25 by adding an N type high concentration GaAs cap layer 19 doped with silicon to about $3 \times 10^{18}$ cm$^{-3}$ on the AlGaAs electron supplying layer 18 in the upper layer, as shown in FIGS. 6a and 6b.

Figure 7B:
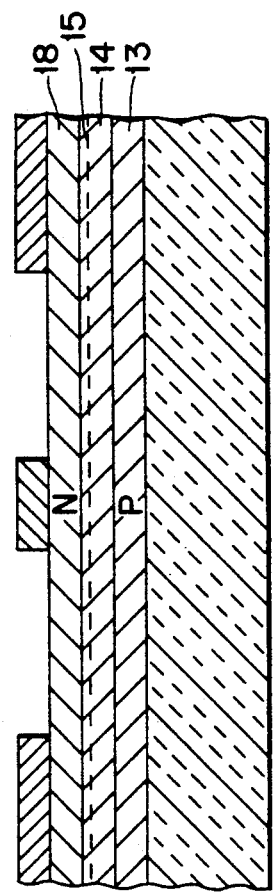
FIGS. 7a and 7b are sectional views taken along the lines A—A and B—B, respectively, in FIG. 1 of a third embodiment of the quasi one-dimensional electron gas FET according to the present invention.
Figure 7A:
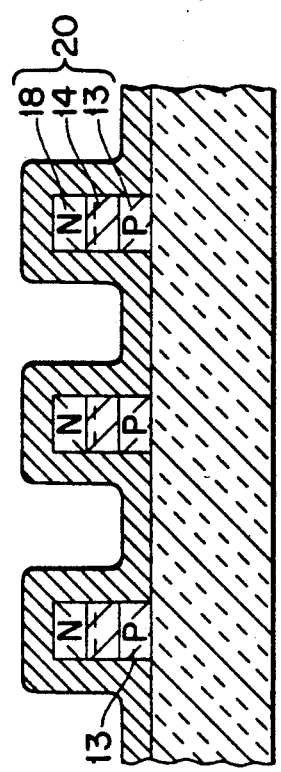

Still further, in the present embodiment an N type AlGaAs layer is used as the material for the lower layer 12 of the stripe structure 20. However, it may be replaced by a high resistance AlGaAs layer or a P type AlGaAs layer. Referring to FIGS. 7a and 7b, by using a P type AlGaAs potential barrier layer 13 for the lower layer of the stripe structure 20, there can be formed a quasi one-dimensional gas 15 only in the upper part of the undoped GaAs channel layer 14 with excellent crystallinity. The structure of this embodiment is identical to that of the first embodiment except for the lower layer 13. For this case, a current gain cut-off frequency of 50 GHz was obtained.

In the above embodiment, the composition ratios of Al:Ga:As=0.3:0.7:1 was employed for the AlGaAs layer 13, but similar effect can be obtained for composition ratios other than the above. Moreover, in the above embodiment use has been made of a heterojunction of GaAs and AlGaAs, but similar effect can also be obtained for other heterojunction materials such as InP-/InGaAs and AlInAs/InGaAs.

Although the invention has been described with reference to specific embodiments, this description is not meant to be construed in a limiting sense. Various modifications of the disclosed embodiments, as well as other embodiments of the invention, will be apparent to persons skilled in the art upon reference to the description of the invention. It is therefore contemplated that the appended claims will cover any modifications or embodiments as fall within the true scope of the invention.

We claim:

1. A field effect transistor comprising:
   a substrate;
   a plurality of stripe layers, each of said stripe layers having a first semiconductor layer and a second semiconductor layer, said first semiconductor layer being formed on said substrate and being undoped, and said second semiconductor layer being formed on said first semiconductor layer, being doped with impurities and having a band gap greater than that of said first semiconductor layer;
   a source electrode and a drain electrode respectively formed on opposing ends of said plurality of stripe layers; and
   a gate electrode formed on an upper surface of each of said second semiconductor layers in said plurality of stripe layers and formed on side surfaces of each of said first and second semiconductor layers in said plurality of stripe layers to cross said plurality of stripe layers without touching said source and drain electrodes.

2. A field effect transistor as recited in claim 1 wherein said second semiconductor layer is of an n-type.

3. A field effect transistor as recited in claim 1, wherein each of said stripe layers further has a third semiconductor layer formed between said first semiconductor layer and said substrate, said third semiconductor layer having a band gap larger than that of said first semiconductor layer.

4. A field effect transistor as recited in claim 3, wherein said gate electrode is formed on side surfaces of each of said third semiconductor layers.

5. A field effect transistor as recited in claim 3, wherein said third semiconductor layer is doped with impurities.

6. A field effect transistor as recited in claim 5, wherein said second and third semiconductor layers are of an n-type.

7. A field effect transistor as recited in claim 5, wherein said second semiconductor layer is of an n-type, and said third semiconductor layer is of a p-type.

8. A field effect transistor as recited in claim 1, wherein said first semiconductor layer is made of gallium arsenide and said second semiconductor layer is made of aluminum gallium arsenide.

9. A field effect transistor as recited in claim 3, wherein said first semiconductor layer is made of gallium arsenide, said second and third semiconductors layers are made of aluminum gallium arsenide.

* * * * *